US008020285B2

(12) United States Patent
Nies et al.

(10) Patent No.: US 8,020,285 B2
(45) Date of Patent: Sep. 20, 2011

(54) METHOD OF ADJUSTING AT LEAST ONE OPTIONAL SETTING OF A PROCESS CHARACTERISTIC OF A COMPONENT PLACEMENT DEVICE, AS WELL AS A COMPONENT PLACEMENT DEVICE AND AN ELECTRONIC KEY

(75) Inventors: Alexander Antonius Franciscus Nies, HP Geldrop (NL); Albertus Robert Wendrich, HE Nuenen (NL); Richard Anthony Wilders, PB Veldhoven (NL)

(73) Assignee: Assembleon N.V., La Veldhoven (NL)

( * ) Notice: Subject to any disclaimer, the term of this patent is extended or adjusted under 35 U.S.C. 154(b) by 1298 days.

(21) Appl. No.: 11/451,609

(22) Filed: Jun. 13, 2006

(65) Prior Publication Data
US 2007/0012766 A1   Jan. 18, 2007

(30) Foreign Application Priority Data

Jun. 14, 2005  (NL) .................................. 1029247

(51) Int. Cl.
*H05K 3/30* (2006.01)
(52) U.S. Cl. ................ 29/832; 29/739; 29/740; 29/743; 29/831; 29/830
(58) Field of Classification Search .................... 29/740, 29/739, 831, 832, 759, 743, 833, 834; 235/382, 235/449, 472.02; 414/416, 222.01, 403; 700/28, 96, 213
See application file for complete search history.

(56) References Cited

U.S. PATENT DOCUMENTS

| 4,366,623 | A | * | 1/1983 | Bergqvist | 33/763 |
|---|---|---|---|---|---|
| 5,287,608 | A | * | 2/1994 | Ellis | 29/33 K |
| 5,323,528 | A | * | 6/1994 | Baker | 29/721 |
| 5,329,690 | A | * | 7/1994 | Tsuji et al. | 29/701 |
| 5,400,497 | A | * | 3/1995 | Watanabe et al. | 29/705 |
| 5,515,600 | A | * | 5/1996 | Iwasaki et al. | 29/740 |
| 5,553,376 | A | * | 9/1996 | Solanki et al. | 29/833 |
| 5,713,125 | A | * | 2/1998 | Watanabe et al. | 29/833 |
| 5,743,001 | A | * | 4/1998 | Baker et al. | 29/740 |
| 6,070,318 | A | * | 6/2000 | Baker et al. | 29/740 |
| 6,256,876 | B1 | * | 7/2001 | Ohe et al. | 29/832 |
| 6,409,642 | B2 | * | 6/2002 | Tominaga et al. | 483/16 |
| 6,546,619 | B1 | * | 4/2003 | Shichi et al. | 29/837 |
| 6,640,423 | B1 | * | 11/2003 | Johnson et al. | 29/740 |
| 6,742,672 | B1 | * | 6/2004 | Lueckehe | 29/809 |
| 6,763,577 | B1 | * | 7/2004 | Laumann | 29/832 |
| 6,862,803 | B2 | * | 3/2005 | Kawase et al. | 29/832 |
| 2005/0065620 | A1 | | 3/2005 | Maenishi et al. | |

FOREIGN PATENT DOCUMENTS

| EP | 0 312 116 A2 | 4/1989 |
|---|---|---|
| EP | 0 948 250 A1 | 10/1999 |
| EP | 1 239 718 A1 | 9/2002 |

* cited by examiner

*Primary Examiner* — Derris H Banks
*Assistant Examiner* — Tai Nguyen
(74) *Attorney, Agent, or Firm* — Foley & Lardner LLP

(57) ABSTRACT

A method and a component placement device are provided for adjusting at least one optional setting of a process characteristic of the component placement device, which component placement device has at least one standard setting. The optional setting may be activated by way of an electronic key supplied to the component placement device. The optional setting may be temporarily activated by feeding the electronic key to the component placement device. Further, the standard setting may be reactivated after the expiration of a predetermined period of operation of the electronic key.

16 Claims, 2 Drawing Sheets

METHOD OF ADJUSTING AT LEAST ONE OPTIONAL SETTING OF A PROCESS CHARACTERISTIC OF A COMPONENT PLACEMENT DEVICE, AS WELL AS A COMPONENT PLACEMENT DEVICE AND AN ELECTRONIC KEY

CROSS-REFERENCE TO RELATED APPLICATIONS

This application claims priority to, and hereby incorporates by reference in its entirety, The Netherlands Patent Application No. 1029247, which was filed on Jun. 14, 2005.

BACKGROUND

The invention relates to a method of adjusting at least one optional setting of a process characteristic of a component placement device provided with at least one component pick-up and placement unit. The invention also relates to a component placement device suitable for carrying out such a method. The invention further relates to an electronic key suitable for use with such a method and/or with such a component placement device.

A conventional method and component placement device are known from International Patent Application Publication No. WO 97/22238. In WO 97/22238, a component is picked-up from a pick-up position of a component feeder by a component pick-up and placement unit. Subsequently, the picked-up component is moved to a component placement position on a substrate, such as a printed circuit board.

Depending on the type of component, the type of substrate, the customer's requirements, etc., a certain degree of precision must be observed in positioning the component on the substrate. In addition, the component must be positioned on the substrate relatively quickly, to optimize the handling capacity, i.e. the number of components to be placed by the component placement device per unit time (and consequently the cost per component to be placed). To that end, a user can adjust optional settings of a process characteristic of the component placement device. Optional settings of a process characteristic include, for example: (a) the maximum rate of picking-up components; (b) the precision with which the components are to be positioned on the substrate; (c) the maximum allowable acceleration forces on the components, etc.

In practice, it has become apparent that the maximum handling capacity of the component placement device may not be fully utilized during some periods. Moreover, during other periods, the maximum handling capacity may be insufficient for the number of components that a user wishes to place on substrates.

The purchase of additional component placement devices to increase the maximum handling capacity available leads to relatively high investment costs. Correspondingly, a relatively large amount of available handling capacity will remain unused during relatively quiet periods, thereby negatively impacting the return on such investment costs.

What is needed, therefore, is an apparatus and a methodology that address at least one if not more of the deficiencies that afflict conventional practice, as previously described. For example, an object of the invention is to provide a method that enables a more efficient use of a component placement device.

SUMMARY

An embodiment of the present invention addresses a method of adjusting at least one optional setting of a process characteristic of a component placement device that is provided with at least one component pick-up and placement unit. The component placement device has at least one standard setting. This method includes, among other possible steps: supplying an electronic key to the component placement device; activating the at least one optional setting by way of the electronic key; and reactivating the at least one standard setting after the expiration of a predetermined period of operation of the electronic key.

When the component placement device is operated with the standard setting of a process characteristic, a predetermined, known result will be obtained. When a different result is to be achieved temporarily, however, the electronic key may be supplied to the component placement device. As a result, the component placement device may operate with the optional setting of the process characteristic in question for a predetermined period of operation. After the expiration of the period of operation, the component placement device may revert to the standard setting of the process characteristic.

As a result of the electronic key, a user may temporarily be able to adapt the component placement device to a desired protocol. For example, the user may purchase the component placement device with one or more standard settings and one or more optional settings at a relatively low price. The optional settings, however, may not be readily activated by the user. Rather, the optional settings may only be temporarily activated for the duration of the predetermined period of operation by purchasing the electronic key associated with the optional setting in question. This makes it possible, for example, to realize a higher handling capacity temporarily.

In a further embodiment of this method, the process characteristic may comprise a plurality of optional settings, which can each be activated by way of electronic keys associated with respective settings. In this way, it is possible to adjust the process characteristic in a plurality of ways dependent on a setting that is required at a specific point in time. For example, if the process characteristic concerns the handling capacity, the handling capacity may, for example, be increased by 10%, 20%, 30% etc., depending on the selected setting.

In another further embodiment of this method, the optional setting may be activated by way of a plurality of different electronic keys, each of which keys has a different period of operation. In this way, the period of operation of the optional setting in question can be selected, as desired. In some embodiments, it may be cheaper to activate the setting for an uninterrupted, relatively long period of operation than it would be to activate the setting for a comparable period of operation using a series different electronic keys.

In another further embodiment of this method, the method may also include the step of: reactivating the at least one standard setting, if the electronic key is removed from the component placement device at a point in time prior to the expiration of the predetermined period of operation. Additionally, the method may also include the step of: reactivating the at least one optional setting using the electronic key for the remaining period of operation. In this way, it is possible to later reactivate the desired optional setting for the remaining period of operation, when the optional setting is required again.

In another further embodiment of this method, the process characteristic may comprise a handling capacity, which is defined by the number of components to be placed by the component placement device per unit time. Further, the handling capacity may be temporarily increased by way of the electronic key. Thus, it is possible to keep the initial costs of the component placement device relatively low, while the desired handling capacity can nevertheless be realized by purchasing the required electronic keys.

In another further embodiment of this method, a velocity at which a component is moved from a component pick-up position to a component placement position may be temporarily adjusted by way of the electronic key. By increasing the rate at which components are placed at a component placement position on a substrate, for example, a higher frequency of placing the component type in question can be realized, thereby resulting in an increased handling capacity of the component placement device.

In another further embodiment of this method, a velocity at which the component pick-up and placement unit is moved from a component placement position to a component pick-up position may be temporarily adjusted by way of the electronic key. Increasing the velocity at which the component pick-up and placement unit is moved to the component pick-up position, e.g., makes it possible to increase the handling capacity in a simple manner.

In another further embodiment of this method, the component placement device may include a plurality of component pick-up positions. Further, the number of component pick-up positions that are accessible to the component pick-up and placement unit may be temporarily adjusted by way of the electronic key. In this way, it is possible to decrease or increase, according to which is desired, the number of different components being presented via the various component pick-up positions. In the case of a larger number of accessible component pick-up positions, a wider range of types of components can be placed on a substrate, thereby enabling the component placement device to be used with a wider range of substrates; this greater usability can only be realized, however, by supplying the electronic key to the component placement device.

In another further embodiment of this method, the component placement device may comprise a plurality of component pick-up and placement units. Further, the number of component pick-up and placement units by way of which components can be picked-up may be temporarily adjusted by way of the electronic key.

In another further embodiment of this method, the component placement device may comprise a substrate supplying and discharging device. Further, the method may additionally include the step of: moving, using the substrate supplying and discharging device, a substrate to and from a position located near the component pick-up and placement unit. Moreover, the velocity at which the substrate is moved may be temporarily adjusted by way of the electronic key. The handling capacity can also be influenced by adapting the velocity of the substrate supplying and discharging device.

Another embodiment of the present invention addresses a component placement device having at least one standard setting. The component placement device includes, among other possible things: at least one component pick-up and placement unit; a mechanism for adjusting an optional setting of a process characteristic of the component placement device; a mechanism for supplying an electronic key to the component placement device; a mechanism for activating the optional setting temporarily on the basis of the electronic key; and a mechanism for activating the standard setting at least after the expiration of a predetermined period of operation of the electronic key. The optional setting, which has a temporary period of operation, makes it possible to have a component placement device operate in a manner that is desired at that moment during the period of operation of the electronic key. As a result, it may be possible, e.g., to realize a higher handling capacity.

Another embodiment of the present invention addresses a method that includes, among other possible steps: providing an electronic key including at least one a bar code, a numerical code, a magnetic code, an optical code, an RF code, a punch code, a chemical code, and a biological code, wherein the electronic key is configured for use in a method of adjusting at least one optional setting of a process characteristic of a component placement device that is provided with at least one component pick-up and placement unit, and wherein the component placement device has at least one standard setting; supplying the electronic key to the component placement device; activating the at least one optional setting by way of the electronic key; and reactivating the at least one standard setting after the expiration of a predetermined period of operation of the electronic key. In a further embodiment of this method, the electronic key may be stored either on a card or electronically.

Another embodiment of the present invention addresses an electronic key that includes, among other possible things: one or more of a bar code, a numerical code, a magnetic code, an optical code, an RF code, a punch code, a chemical code, and a biological code. This electronic key is configured for use in a component placement device that has at least one standard setting. The component placement device includes, among other possible things: at least one component pick-up and placement unit; a mechanism for adjusting an optional setting of a process characteristic of the component placement device; a mechanism for supplying the electronic key to the component placement device; a mechanism for activating the optional setting temporarily on the basis of the electronic key; and a mechanism for activating the standard setting at least after the expiration of a predetermined period of operation of the electronic key. In a further embodiment of this electronic key, the electronic key may be stored either on a card or electronically.

Another embodiment of the present invention addresses an electronic key that includes, among other possible things: one or more of a bar code, a numerical code, a magnetic code, an optical code, an RF code, a punch code, a chemical code, and a biological code. This electronic key is configured for use in a method of adjusting at least one optional setting of a process characteristic of a component placement device that is provided with at least one component pick-up and placement unit. The component placement device has at least one standard setting. The method includes, among other possible steps: supplying the electronic key to the component placement device; activating the at least one optional setting by way of the electronic key; and reactivating the at least one standard setting after the expiration of a predetermined period of operation of the electronic key. In a further embodiment of this method, the electronic key may be stored either on a card or electronically.

These and other features, aspects, and advantages of the present invention will become more apparent from the following description, appended claims, and accompanying exemplary embodiments shown in the drawings.

DETAILED DESCRIPTION

Figure 1:
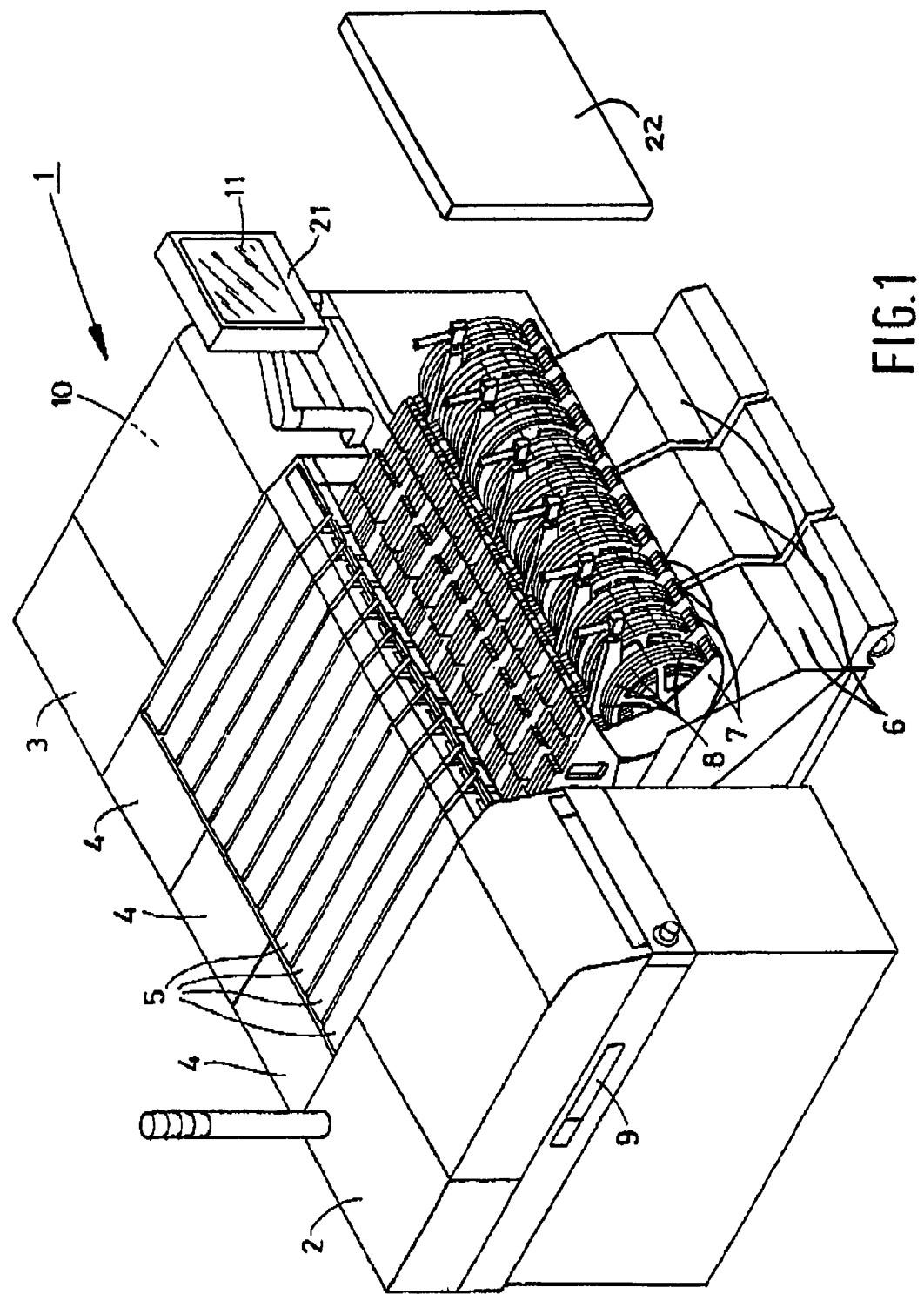
FIG. 1 is a perspective view of an embodiment of a component placement device according to the present invention.

Presently preferred embodiments of the invention are illustrated in the drawings. An effort has been made to use the same, or like, reference numbers throughout the drawings to refer to the same or like parts.

FIG. 1 shows a component placement device 1 according to the invention. The component placement device 1 includes: (a) a control unit 11; (b) a substrate supplying device 2; (c) a substrate discharging device 3; (d) three modules 4 each consisting of four component pick-up and placement units 5; and (e) three trolleys 6, which are each provided with four reel holders 7. Each of the reel holders 7 accommodates six reels 8; tapes carrying components 19 (shown in FIG. 2) are wound on each reel 8. The number of modules 4 and the corresponding number of trolleys 6 can be determined by a user according to his particular requirements upon purchase of the component placement device 1.

The substrate supplying device 2 is provided with a substrate inlet opening 9, via which substrates 17 (shown in FIG. 2) can be supplied to the component placement device 1. The substrate discharging device 3 is provided with a substrate outlet opening 10, via which the substrates 17 provided with components 19 can be discharged from the component placement device 1. The component placement device 1 furthermore comprises two parallel rails 16 that support a substrate 17 to be provided with components 19. The substrate 17 can be moved stepwise at a specified carrying velocity over the rails 16 from the substrate inlet opening 9 to the substrate outlet opening 10.

Figure 2:
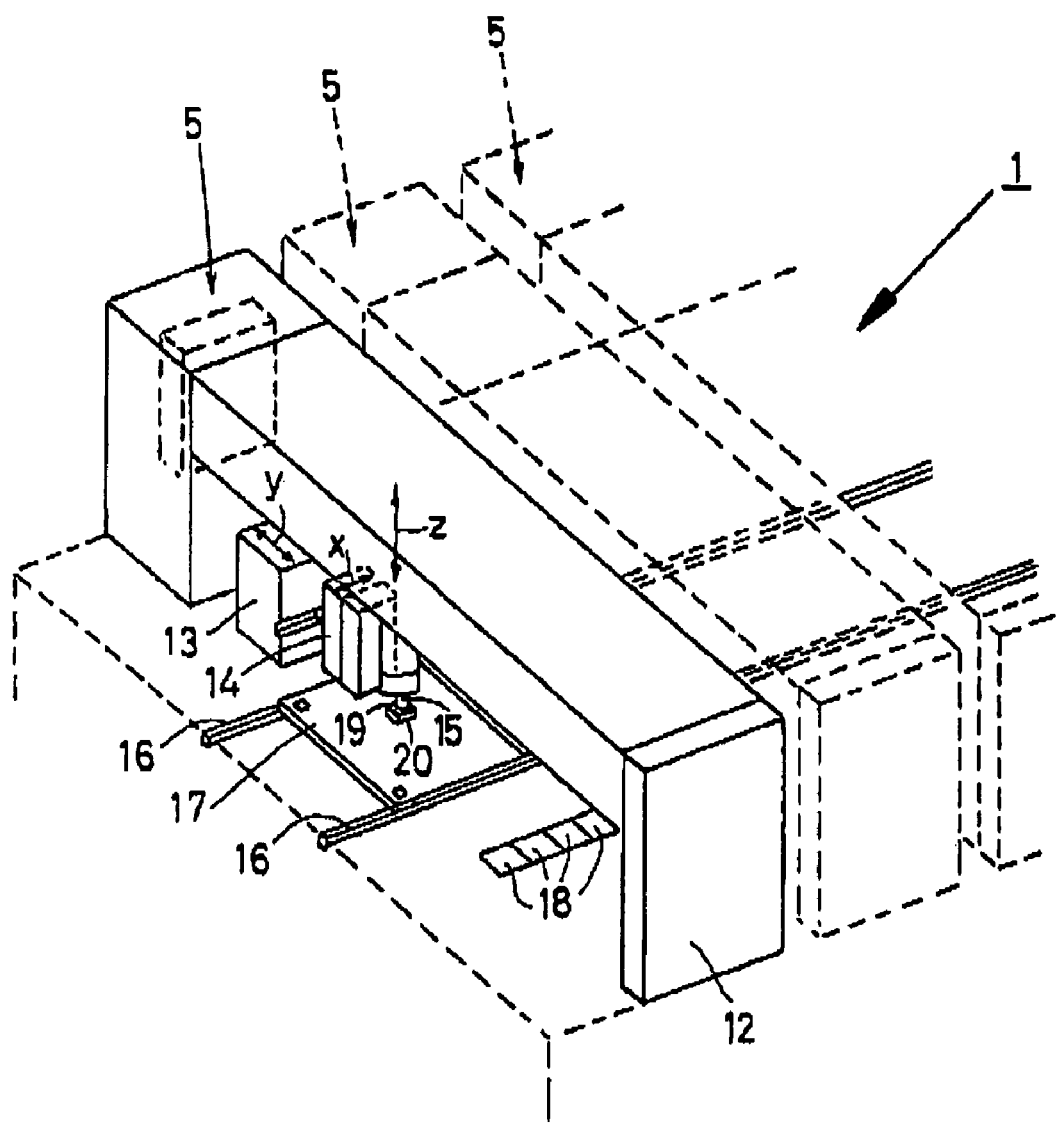
FIG. 2 is a schematic, perspective view of a part of the component placement device that is shown in FIG. 1.

FIG. 2 is a perspective view of a part of the component placement device 1 that is shown in FIG. 1, in which the structure of an individual component pick-up and placement unit 5 is clearly shown. Each of the component pick-up and placement units 5 comprises: (a) an elongated, U-shaped frame 12; (b) a first slide 13 (which is movable in the directions indicated by the double arrow Y with respect to the frame 12); (c) a second slide 14 (which is movable in the directions indicated by the double arrow X with respect to the slide 13); and (d) a vacuum tube 15 (which is movable in the directions indicated by the double arrow Z with respect to the second slide 14).

Each component pick-up and placement unit 5 includes a plurality of component pick-up positions 18. The number of component pick-up positions 18 corresponds to the reels 8 in the reel holder 7 that are associated with the component pick-up and placement unit 5. The component placement device 1 is controlled by the control unit 11 such that a desired component 19 is picked-up from a component pick-up position 18 by the vacuum tube 15 of a component pick-up and placement unit 5. Subsequently, the component 19 picked-up by way of the vacuum tube 15 is moved to a component placement position 20 on the substrate 17 and placed on the substrate 17 at that position. The component placement device 1 as described so far and the operation thereof are conventional and, therefore, a further explanation thereof will not be provided.

As previously indicated, the component placement device 1 may be extended by adding additional modules 4. In this way, a process characteristic (e.g., the number of different types of components that can be placed on a substrate 17 upon passage through the component placement device 1) may be enhanced, thereby increasing the handling capacity of the component placement device 1. In addition, this makes it possible to place specific components, which are to be placed on the substrate 17 with a relatively high degree of precision, on the substrate 17 at a relatively slow rate. Although the specific components are placed at a relatively slow rate, this does not lead to a slower rate of movement of the substrate 17 through the component placement device 1 on account of the fact that the placement of the specific components is carried out by several component pick-up and placement units. As previously indicated, physically extending the device by increasing the number of modules 4 has a drawback in that substantial additional investments are required. Moreover, if the component placement device 1 is to be extended at some point after its initial use, the component placement device 1 must be temporarily taken-out of service, as a result of which no substrates can be provided with components.

In contrast to the drawbacks associated with conventional component placement devices, the component placement device 1 according to the present invention may include the maximum possible number of modules 4 or the number of modules 4 that a user typically requires to realize a standard desired maximum handling capacity. Specifically, upon purchase of the component placement device 1, a basic (i.e., typical) handling capacity is predetermined. Associated with the basic handling capacity are standard settings of the component placement device 1. Such standard settings include: (a) as the maximum allowable velocities at which the vacuum tubes 15 can be moved in the directions indicated by the arrows X, Y, Z; (b) the maximum allowable accelerations at which the X, Y, Z movements can occur; (c) the maximum allowable jerk; (d) the minimum and maximum allowable waiting times and overlaps; (e) the required safety margins; (f) the maximum velocity at which substrates 17 can be moved over the rails 16; (g) the rate at which new components 19 are presented at the component pick-up positions 18, etc.

The standard settings are input into the control unit 11 of the component placement device 1. Different standard settings may be input for different types of components. Thus, a plurality of standard settings may be input for a particular process characteristic, such as the velocity, the acceleration, etc. The combination of all the standard settings is such that the basic handling capacity can be realized when using the standard settings.

If a higher handling capacity of the component placement device 1 is temporarily required (e.g., on account of an increased market demand), an electronic key may be supplied to the component placement device 1 according to the present invention. By way of the electronic key, an optional setting of at least one process characteristic may be temporarily enabled. The optional setting may be, for example, a higher maximum allowable velocity, a higher allowable acceleration, etc. The ability to alter the settings makes it possible to place more components 20 on a substrate 17 within a given period of time, thereby increasing the handling capacity of the component placement device 1.

The electronic key may be an electronic code stored on a physical card 22. The code may be, for example, a bar code, a numerical code, a magnetic code, an optical code, an RF code, a punch code, a chemical code, a biological code, etc. Such a card 22 can be physically fed to the component placement device 1 via a card reader 21 present in the control unit 11. It is also possible to supply the electronic key to the component placement device 1 from a remote computer (not shown) via an electronic network (not shown).

Different types of electronic keys may be supplied to the component placement device 1. A first type of electronic key may, for example, only be used to increase the maximum handling capacity that can be realized. A second type of electronic key may only be used to enhance the placement precision to be realized. Moreover, a specific electronic key may be associated with each individual component pick-up and placement unit 5.

As previously indicated, in the embodiment of a component placement device 1 as shown herein, a certain number of reels 8 are associated with each component pick-up and placement unit 5. It is, therefore, possible that the standard setting will only use, e.g., half of the available reels 8. As a result, supplying an electronic key may enable the user to use the remaining reels 8 and, therefore, supply more components to the component pick-up positions 18 from all of the reels 8.

It is also possible to fit the component pick-up and placement units 5 with cameras, which can only be activated by way of the electronic key. The cameras may be used to ensure a certain level of precision in placement of the components 19 on the substrates 17.

During the movement of the suction tube 15 holding a component 20 from the component pick-up position 18 to the substrate 17, the maximum allowable accelerations and velocities are comparatively limited in order to ensure that the component 20 is precisely positioned on the substrate 17. The return movement of the suction tube 15 from the substrate 17 to the component pick-up position 18 (to pick-up another component 20) has practically no effect on the precision with which a component 20 is placed on a substrate 17. As a result, the maximum allowable accelerations and velocities may be significantly higher when returning the vacuum tube 15 to the pick-up position 18. By using the electronic key, higher velocities and accelerations (e.g., for the vacuum tube when returning to the pick-up position 18) can be realized by way of the optional setting. In other words, higher velocities and acceleration, in comparison with the standard settings, can be achieved in a simple manner. Moreover, it is possible in this context to enhance the optional settings to different degrees by using different electronic keys.

Using the electronic key, the component placement device 1 will temporarily operate with the optional setting(s). After the expiration of a predetermined period of operation $\Delta t$ associated with the electronic key, the standard setting(s) of the component placement device 1 may be reactivated. Different keys may have different predetermined periods of operation $\Delta t$. Using various electronic keys it is possible, for example, to increase the optional setting in steps or to use a particular optional setting during a shorter or a longer period $\Delta t$. A plurality of possibilities are shown by way of example in the Table 1.

TABLE 1

|  | +10% | +20% | +30% | +40% |
| --- | --- | --- | --- | --- |
| $\Delta t$ | x1 | x2 | x3 | x4 |
| $2\Delta t$ | x2 | x4 | x6 | x8 |
| $3\Delta t$ | x3 | x6 | x9 | x12 |
| $4\Delta t$ | x4 | x8 | x12 | x16 |

The electronic key x1 is used to activate, for a period of operation $\Delta t$ of, e.g., 1 week, an optional setting or optional settings by which the total handling capacity of the component placement device is increased by 10%. The electronic key x2 enables the user to realize either a 20% higher handling capacity for a period of operation $\Delta t$ or a 10% higher handling capacity for a period of operation $2\Delta t$. In either case, the same capacity improvement will be obtained after the expiration of the period of operation.

A user may purchase a plurality of electronic keys dependent on the expected need for increasing the handling capacity. In some embodiments, the cost associated with two electronic keys x6 may be higher than the cost of single electronic key x12.

It is possible to terminate the operation of an electronic key before the expiration of the period of operation $\Delta t$ of the electronic key. Subsequently, the standard settings may be reactivated. Moreover, if the standard settings are reactivated, it may be possible, if desired, to reactivate the optional settings associated with the electronic key for the remaining period of operation at a later point in time. To that end, a time registration may be added to the electronic key, whereby both the period of operation $\Delta t$ and the elapsed time during which the electronic key was used may be stored on the electronic key.

The period of operation may be limited. According to another possibility, however, the period of operation may be determined by a predetermined number of components placed on substrates while using the optional setting(s) associated with the electronic key. In other words, an electronic key may have no predetermined period of operation but instead would have a predetermined number of components to be placed on the substrates such that the component placement device 1 will operate under the optional setting(s) associated with the electronic key until the predetermined number of components are placed on the substrates.

It is also possible to reduce the maximum handling capacity by way of the electronic key. In such case, the user may be given, e.g., a discount on the purchase of other electronic keys.

Using the method according to the present invention, it is also possible to optimize the simultaneous use of a plurality of component placements devices. Moreover, such optimization may occur not only within a production line (and/or between production lines) but also between different production facilities at different locations.

Although the aforementioned describes embodiments of the invention, the invention is not so restricted. It will be apparent to those skilled in the art that various modifications and variations can be made to the disclosed embodiments of the present invention without departing from the scope or spirit of the invention. Accordingly, these other apparatuses and methods are fully within the scope of the claimed invention. Therefore, it should be understood that the apparatuses and methods described herein are illustrative only and are not limiting upon the scope of the invention, which is indicated by the following claims.

What is claimed is:

1. A method of adjusting at least one optional setting of a process characteristic of a component placement device that is provided with at least one component pick-up and placement unit, wherein the component placement device has at least one standard setting of the process characteristic, the method comprising the steps of:

supplying an electronic key to the component placement device;

activating the at least one optional setting of the process characteristic by way of the electronic key;

temporarily using the at least one optional setting of the process characteristic instead of the at least one standard setting of the process characteristic;

reactivating the at least one standard setting of the process characteristic after the expiration of a predetermined period of operation, defined by one of a time period and placement of a predetermined number of components on a substrate, of the electronic key; and operating the component placement device with the at least one standard setting of the process characteristic.

2. The method according to claim 1, wherein the process characteristic comprises a plurality of optional settings, which can each be activated by way of electronic keys associated with respective settings.

3. The method according to claim 1, wherein the optional setting of the process characteristic is configured to be activated by way of a plurality of different electronic keys, each of which keys has a different period of operation.

4. The method according to claim 1, further comprising the step of:
reactivating the at least one standard setting of the process characteristic, if the electronic key is removed from the component placement device at a point in time prior to the expiration of the predetermined period of operation.

5. The method according to claim 4, further comprising the step of:
reactivating the at least one optional setting of the process characteristic using the electronic key for the remaining period of operation.

6. The method according to claim 1, wherein the process characteristic comprises a handling capacity, which is defined by the number of components to be placed by the component placement device per unit time.

7. The method according to claim 6, wherein the handling capacity is temporarily increased by way of the electronic key.

8. The method according to claim 1, wherein a velocity at which a component is moved from a component pick-up position to a component placement position is temporarily adjusted by way of the electronic key.

9. The method according to claim 1, wherein a velocity at which the component pick-up and placement unit is moved from a component placement position to a component pick-up position is temporarily adjusted by way of the electronic key.

10. The method according to claim 1, wherein the component placement device includes a plurality of component pick-up positions.

11. The method according to claim 10, wherein the number of component pick-up positions that are accessible to the component pick-up and placement unit is temporarily adjusted by way of the electronic key.

12. The method according to claim 1, wherein the component placement device comprises a plurality of component pick-up and placement units.

13. The method according to claim 12, wherein the number of component pick-up and placement units by way of which components can be picked-up is temporarily adjusted by way of the electronic key.

14. The method according to claim 1, wherein the component placement device comprises a substrate supplying and discharging device.

15. The method according to claim 14, further comprising the step of: moving, using the substrate supplying and discharging device, a substrate to and from a position located near the component pick-up and placement unit.

16. The method according to claim 15, wherein the velocity at which the substrate is moved is temporarily adjusted by way of the electronic key.

* * * * *